United States Patent
Yang et al.

(10) Patent No.: US 9,379,081 B2
(45) Date of Patent: Jun. 28, 2016

(54) SEMICONDUCTOR DEVICE PACKAGE AND METHOD OF THE SAME

(71) Applicant: King Dragon International Inc., Tortola (VG)

(72) Inventors: Wen Kun Yang, Hsinchu (TW); Yu-Hsiang Yang, Hsinchu (TW)

(73) Assignee: KING DRAGON NTERNATIONAL INC., Tortola (VG)

( * ) Notice: Subject to any disclaimer, the term of this patent is extended or adjusted under 35 U.S.C. 154(b) by 0 days.

(21) Appl. No.: 14/223,157

(22) Filed: Mar. 24, 2014

(65) Prior Publication Data

US 2015/0270239 A1   Sep. 24, 2015

(51) Int. Cl.

| | |
|---|---|
| *H01L 23/48* | (2006.01) |
| *H01L 23/00* | (2006.01) |
| *H01L 23/538* | (2006.01) |
| *H01L 23/544* | (2006.01) |
| *H01L 21/268* | (2006.01) |
| *H01L 21/304* | (2006.01) |
| *H01L 21/768* | (2006.01) |

(52) U.S. Cl.
CPC .............. *H01L 24/32* (2013.01); *H01L 21/268* (2013.01); *H01L 21/304* (2013.01); *H01L 21/76802* (2013.01); *H01L 23/5384* (2013.01); *H01L 23/544* (2013.01); *H01L 24/09* (2013.01); *H01L 24/16* (2013.01); *H01L 24/81* (2013.01); *H01L 24/83* (2013.01); *H01L 24/91* (2013.01); *H01L 2223/54426* (2013.01); *H01L 2223/54486* (2013.01); *H01L 2224/0231* (2013.01); *H01L 2224/02372* (2013.01); *H01L 2224/03015* (2013.01); *H01L 2224/0401* (2013.01); *H01L 2224/0918* (2013.01); *H01L 2224/13144* (2013.01); *H01L 2224/16113* (2013.01); *H01L 2224/16221* (2013.01); *H01L 2224/16225* (2013.01); *H01L 2224/32221* (2013.01); *H01L 2224/32225* (2013.01); *H01L 2224/73204* (2013.01); *H01L 2224/8113* (2013.01); *H01L 2224/81201* (2013.01); *H01L 2224/81815* (2013.01); *H01L 2224/8385* (2013.01); *H01L 2924/01014* (2013.01); *H01L 2924/12* (2013.01); *H01L 2924/12042* (2013.01); *H01L 2924/12043* (2013.01); *H01L 2924/1461* (2013.01); *H01L 2924/15151* (2013.01); *H01L 2924/15311* (2013.01)

(58) Field of Classification Search
CPC ...... H01L 24/32; H01L 24/09; H01L 23/5384
See application file for complete search history.

(56) References Cited

U.S. PATENT DOCUMENTS

| | | |
|---|---|---|
| 5,786,589 A | 7/1998 | Segawa et al. |
| 6,144,507 A | 11/2000 | Hashimoto |

(Continued)

*Primary Examiner* — Jerome Jackson, Jr.
*Assistant Examiner* — Wasiul Haider
(74) *Attorney, Agent, or Firm* — Muncy, Geissler, Olds & Lowe, P.C.

(57) ABSTRACT

The invention proposes a semiconductor device package structure, comprising a substrate, an adhesive layer and a die. The substrate has electrical through-holes to inter-connect a first and second wiring circuit on a top surface and a bottom surface of the substrate respectively, wherein a contact conductive bump is formed on the first wiring circuit. The underfill adhesive layer is formed on the top surface and the first wiring circuit of the substrate except the area of the die. The die has a bump structure on the bonding pads of the die, wherein the bump structure of the die is electrically connected to the contact conductive bump of the first wiring circuit of the substrate.

3 Claims, 11 Drawing Sheets

(56) References Cited

U.S. PATENT DOCUMENTS

| | | |
|---|---|---|
| 6,885,107 B2 | 4/2005 | Kinsman |
| 2005/0214971 A1* | 9/2005 | Hung .......................... 438/106 |
| 2010/0072588 A1* | 3/2010 | Yang ................. H01L 23/49816 257/676 |
| 2012/0043635 A1* | 2/2012 | Yang ...................... H01L 24/24 257/432 |
| 2012/0280374 A1* | 11/2012 | Choi et al. .................... 257/659 |

* cited by examiner

SEMICONDUCTOR DEVICE PACKAGE AND METHOD OF THE SAME

TECHNICAL FIELD

The invention relates to a semiconductor device package, and more particularly to a semiconductor device package with dual substrates having die embedded therein.

BACKGROUND

In the field of semiconductor devices, the device density is increased and the device dimension is reduced, continuously. The demand for the packaging or interconnecting techniques in such high density devices is also increased to fit the situation mentioned above. Conventionally, in the flip-chip attachment method, an array of solder bumps is formed on the surface of the die after the re-distribution layer be formed. The formation of the solder bumps may be carried out by using a solder composite material through a solder mask for producing a desired pattern of solder bumps. The function of chip package includes power distribution, signal distribution, heat dissipation, protection and support, and so on. As a semiconductor become more complicated, the traditional package technique, for example lead frame package, flex package, rigid package technique, can't meet the demand of producing smaller chip with high density elements on the chip. The trend of package technique is toward ball grid array (BGA), flip chip ball grid array (FC-BGA), chip scale package (CSP), wafer level package (WLP) today.

Image sensors have become widely used in digital still cameras, cellular phones, automobile, and other applications. The technology used to manufacture image sensors, and in particular CMOS image sensors, has continued to advance at great pace. For example, the demands of higher resolution and lower power consumption have encouraged the further miniaturization and integration of the image sensor. In a large number of image sensors, a photodiode structure called a pinned or a buried photodiode is used because of its low noise performance. In this photodiode structure, a P+ layer is implanted at or below the surface of the photodiode adjacent to a transfer gate. An N− layer is implanted deeper into the silicon substrate. This is the buried layer that stores charge away from the surface region, and thus, away from defects at the surface of the silicon substrate. The purpose of the P+ layer is to provide a photodiode with increased storage capacitance and to passivate the defects on the photodiode surface.

Various structures using flip-chip mounting of an image sensor chip have been developed in an attempt to simplify the construction of image sensor packages. U.S. Pat. No. 6,144,507 discloses an image sensor chip mounted directly to a printed circuit board (PCB). An image sensor chip is mounted in flip-chip fashion over an aperture within the PCB, and a transparent cover is either attached directly to the active surface of the chip or bonded to the side of the PCB opposite that to which the image sensor chip is attached and over the aperture. Although these methods eliminate the difficulties associated with wire bonding, however, the PCB's is very large with respect to the size of the image sensor chip and the transparent cover.

U.S. Pat. No. 5,786,589 disclosed the features of bonding a TAB sheet to a glass substrate and bonding an image sensor chip to the TAB tape with a conductive film. This design requires a specialized substrate attachment technique due to the TAB-type connection leads. Moreover, the conductive film risks interference with sensing circuitry on the image sensor chip and requires the formation of dummy leads or dam structures to compensate for this problem.

U.S. Pat. No. 6,885,107 disclosed conventional type image sensor package. It employed a BGA package which includes a plurality of ball under the substrate and the die is exposed outside of the substrate. In accordance with the present invention, image sensor packaging having the above-described and other beneficial characteristics and methods for fabrication thereof are provided. An image sensor chip is flip-chip mounted to conductive traces on a first surface of a transparent substrate. The active surface of the image sensor chip is protected from contamination after mounting by depositing a bead of sealant around the periphery of the image sensor chip between the active surface of the image sensor chip and the first surface of the substrate, thus eliminating any need for additional damming structures or spacing frames as used in the prior art. Discrete conductive elements such solder balls or columns are attached to ends of the conductive traces which form an array pattern, the discrete conductive elements extending transversely from the conductive traces on the first surface to a substantially common plane at a level beyond a back surface of the image sensor chip. The resulting structure comprises a board-over-chip (BOC) package arrangement. Thus, the thickness of the substrate is unlikely to be scaled down due to the structure has ball high and extruding die receiving structure which limits the scale of the package shrinkage.

The prior arts suffer complicated processes to form the image package and the package structure is unable to be scaled down. Further, these prior arts only disclosed single chip package, no multiple chip structure is illustrated. Therefore, based-on the shortcomings of there prior arts, the present invention provide a semiconductor device package manufactured by simpler processes, with better reliability.

SUMMARY OF THE INVENTION

An objective of the invention is to provide a semiconductor device package structure.

Another objective of the invention is to provide a single or multiple chips package with dual substrate having pre-formed through holes and die receiving opening.

Yet another object of the invention is to provide semiconductor chips package with dual substrate having die opening window to improve the reliability and shrinking the device size.

The further object of the invention is to provide an image sensor package with dual substrates which have lower and upper wiring patterns by copper clad laminated (CCL) and E-plating Cu/Au or Cu/Ni/Au metal for increasing electrical conductivity.

According to an aspect of the invention, it proposes a semiconductor device package structure, comprising a substrate, an adhesive layer and a die. The substrate has electrical through-holes to inter-connect a first wiring circuit on a top surface of the substrate and a second wiring circuit on a bottom surface of the substrate, wherein a contact conductive bump is formed on the first wiring circuit except the electrical through-holes area. The adhesive layer is formed on the top surface and the first wiring circuit of the substrate. The die has a bump structure on the bonding pads of the die (no re-distribution layer needed), wherein the bump structure of the die is electrically connected to the contact conductive bump of the first wiring circuit of the substrate. Especially, the adhesive layer is formed only under the die for adhering the die and the substrate.

In an aspect, a second contact conductive bump is formed on the second wiring circuit of the substrate.

In another aspect, the package structure further comprises a cover layer on said top surface of the substrate and a bottom surface of the die.

In yet another aspect, the package structure further comprises a second substrate with a die receiving opening and a third wiring circuit on a top surface of the second substrate and a fourth wiring circuit on a bottom surface of the second substrate, wherein a second contact conductive bump is formed on the third wiring circuit of the second substrate except the electrical through-holes area; and a re-distribution layer structure on the top surface of the second substrate to electrically connect to the fourth wiring circuit of the second substrate.

In one aspect, the package structure further comprises a dielectric layer on the die and the second substrate with an opening for via formed therein; a cover layer on the dielectric layer and the re-distribution layer.

In another aspect, the package structure further comprises a passive component and an active component electrically connected to the re-distribution layer.

In yet another aspect, the package structure further comprises a third substrate with a second die receiving opening and a fifth wiring circuit on a top surface of the third substrate and a sixth wiring circuit on a bottom surface of the third substrate, wherein a second contact conductive bump is formed on the sixth wiring circuit except the electrical through-holes area; a second die with a second bump structure on bonding pads of the second die, wherein the second bump structure of the second die is electrically connected to the second contact conductive bump of the sixth wiring circuit of the third substrate. A cover layer may be formed on/to cover the second die and the third substrate.

According to an aspect of the invention, it proposes a semiconductor device package structure, comprising a first and second substrate, a first and second adhesive layer and a die. The first substrate has a die receiving opening and a first wiring circuit on a top surface of the substrate and a second wiring circuit on a bottom surface of the substrate, wherein a contact conductive bump is formed on the second wiring circuit. The die has a bump structure on the bonding pads of the die. The first adhesive layer is formed on the bottom surface of the first substrate and the die, and filled into the gap between the die and the first substrate for adhering the die and the first substrate. The second substrate has a die opening window and a third wiring circuit on a top surface of the second substrate and a fourth wiring circuit on a bottom surface of the second substrate, wherein a contact conductive bump is formed on the fourth wiring circuit. The bump structure of the die is electrically connected to the contact conductive bump of the fourth wiring circuit of the second substrate. The second adhesive layer is formed under the second substrate except the die opening window for adhering the die and the second substrate.

In one aspect, the size of the die opening window of the second substrate is smaller than that of the die receiving opening of the first substrate. The die is a MEMS sensor device, for example image sensor chip, a navigate sensor chip, a pressure sensor chip, a CDR sensor (fluidic sensor) chip, a voice sensor chip, or a biochip sensor.

According to an aspect of the invention, it proposes a method for forming a semiconductor device package, comprising: preparing a first substrate and a second substrate, wherein the first substrate includes a wiring circuit and an aligning mark disposed on a top surface thereof and a contact conductive bump is formed on the wiring circuit; opening a die opening window through the second substrate by using a laser or punching method; preparing an adhesive material; attaching the second substrate to the first substrate by the adhesive material such that the adhesive material is disposed between a top surface of the first substrate and a bottom surface of the second substrate to directly attach the second substrate onto the first substrate excluding the contact conductive bump area; aligning a die with a bump structure on the bonding pads of the die by using the aligning mark and attaching the die onto said contact conductive bump with force by said adhesive material such that the bump structure of the die is electrically connected to the contact conductive bump of the wiring circuit of the first substrate; forming a dielectric layer on a top surface of the second substrate and the die and pushing the dielectric layer into a gap between a side wall of the die and a side wall of the die opening window; opening a plurality of via openings in the dielectric layer; and forming a redistribution layer in the plurality of via openings and on the dielectric layer.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Reference will now be made in detail to several embodiments, examples of which are illustrated in the accompanying figures. It is noted that wherever practicable similar or like reference numbers may be used in the figures and may indicate similar or like functionality. The figures and accompanying description depict various embodiments for purposes of illustration only. One skilled in the art will readily recognize from the following description that alternative embodiments of the structures and methods illustrated herein may be employed without departing from the principles described herein.

Figure 1:
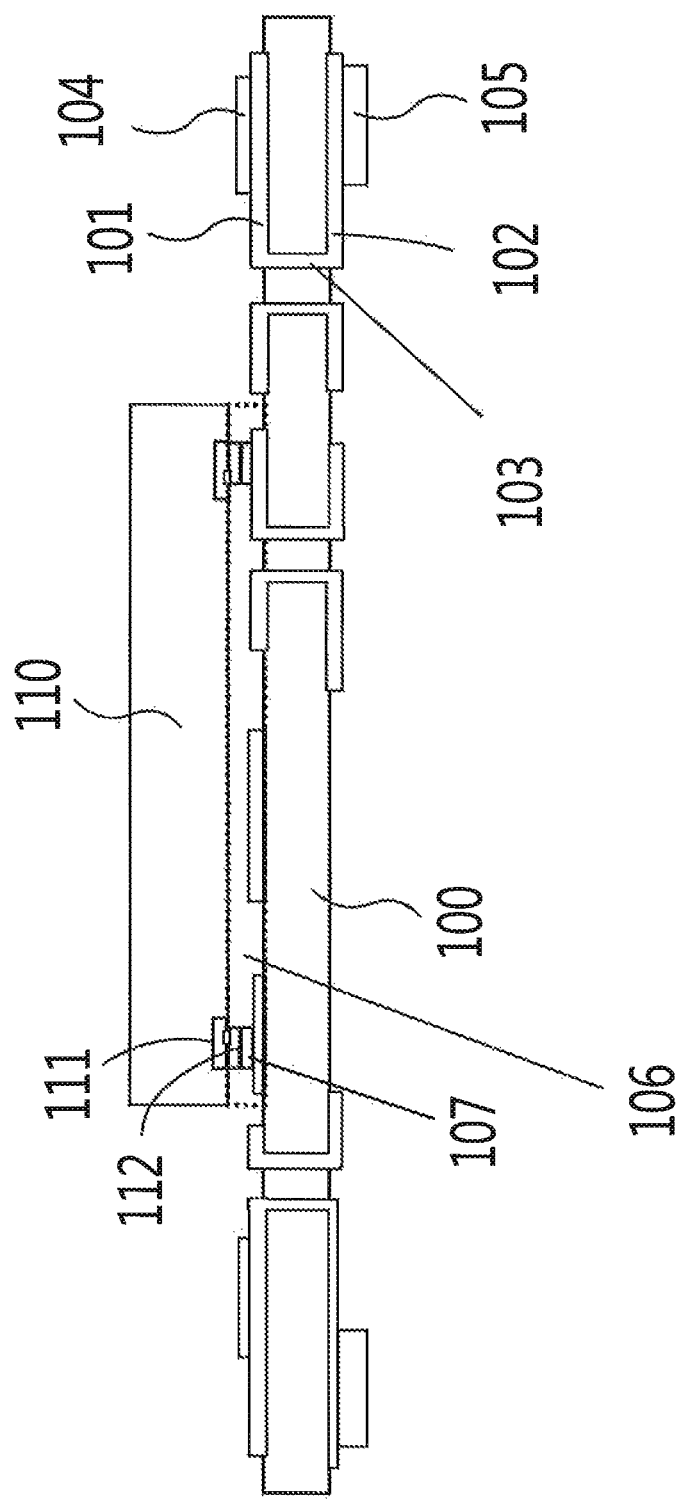
FIG. 1 illustrates a cross-sectional view of a semiconductor device package structure according to one embodiment of the invention.

FIG. 1 illustrates a cross-sectional view of a semiconductor device package structure according to the first embodiment of the invention. As shown in FIG. 1, the semiconductor device package includes a substrate 100, an adhesive layer 106 and a die 110. The substrate 100 includes a wiring pattern 101 formed on a top surface of the substrate 100 and a wiring pattern 102 formed on a bottom surface of the first substrate 100. A connecting conductive through holes 103 may be formed for penetrating through the substrate 100 connected to the wiring pattern 101, 102 for electrical connection. The conductive through holes 103 may be made of copper and formed by an electro-plating process. Contact conductive bump 104, 107 is formed on the wiring circuit 101, and contact conductive bump 105 is formed on the wiring circuit 102, respectively, excluding area of the electrical through-holes 103. The die 110 has conductive (such as Al or Au) bonding pads 111 (I/O pads) formed thereon. The die 110 has a conductive bump 112 formed on the bonding pads 111, and the die 110 faces down to make the conductive bump 112 electrically connect to the contact the conductive bump 107 (to wiring circuit 101) of the substrate 100. The die 110 is disposed on the substrate 100. The thickness of the die 110 is around 50~250 um (microns). Materials of the contact conductive bump 104, 107, 112 include solder bump, solder ball or gold bump or stud bump. The adhesive layer 106 is formed on the top surface of the substrate 100 and the wiring circuit 101 of the substrate 100, wherein the adhesive layer 106 is formed between the die 110 and the substrate 100 to adhere a top surface (active area surface; in another application, it also can be the non-active area surface by using the TSV technology to extend the bump structure on the backside of die) of the die 110 and the top surface of the substrate 100. Moreover, no adhesive layer is formed on area of the top surface of the substrate 100 outside area of die size (except the area of the die). The adhesive layer 106 is formed only under the die 110 for adhering the die 110 and the substrate 100. Thus, the adhesive layer 106 is "under-fill" adhesive layer (under the die 110). The adhesive layer 106 is formed on the substrate 100 by a dry film at high vacuum, pressure condition. The size of the "under-fill" adhesive layer may be controlled. Then, a photo-lithography process is performed to open the "bump" area on the substrate 100 for exposing the adhesive layer 106. The adhesive layer 106 is cured at temperature 150° C. under pressure, final curing at 180° C., with elastic properties. Next, solder bump is re-flowing for soldering join the "bump" between die and substrate. In this embodiment, no RDL is needed in bare chip package structure.

The conductive through holes 103 may be filled with conductive material, such as metal, alloy. In one example, they are formed with copper by Electro-plating technology. Preferably, material of the substrate 100 is organic substrate likes epoxy type FR5, BT, PCB. Preferably, the organic substrate with high glass transition temperature (Tg) are epoxy type FR5 or BT (Bismaleitnide triazine) type substrate, the above materials can be easy to form the circuit pattern and interconnecting through holes. The Cu metal (CTE around 16) can be used also. The glass, ceramic, silicon can be used as the substrate. The adhesion material 106 is preferably to form of polymer with silicone rubber based elastic materials. It is because that the CTE (X/Y direction) of the epoxy type organic substrate (FR5/BT) is around 14-17 and the CTE in Z direction is about 30-60, it can reduce the die shift issue and thermal stress during the temperature curing of the adhesion material. In one embodiment of the invention, the material of the wiring layers 101, 102 include Cu, Cu/Ni/Au alloy or Cu/Au alloy; the thickness of the wiring layers is from 5 um to 25 um (it also can be thicker than 25 um if necessary). The CCL (copper clad laminated) is formed by lamination also as seed metal layers, and the Cu/Au or Cu/Ni/Au alloy is formed by electroplating; exploiting the electro-plating process to form the wiring layers with enough thickness and better mechanical properties to withstand CTE mismatching during temperature cycling and mechanical bending. The conductive pads can be Au or Cu/Au or Al or combination thereof. All of the conductive through holes may be formed by CNC or laser drilling.

Figure 2:
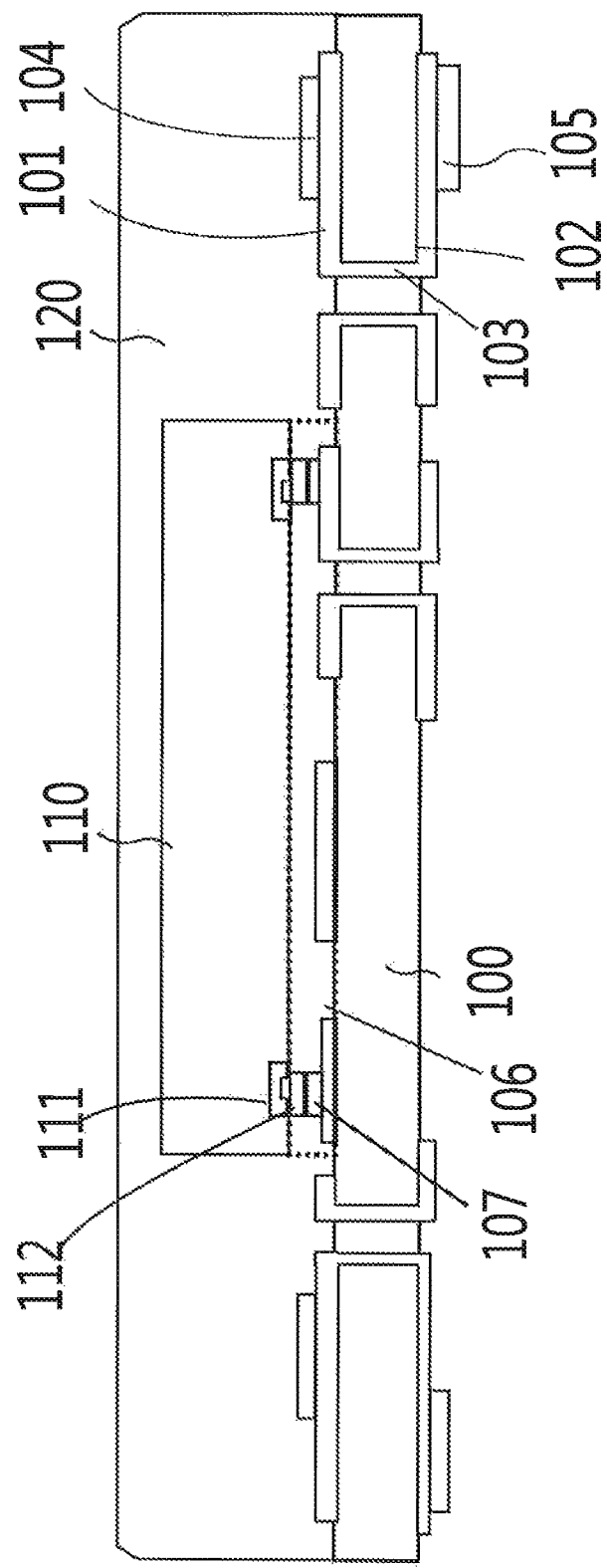
FIG. 2 illustrates a cross-sectional view of a semiconductor device package structure with cover layer according to another embodiment of the invention.
Figure 3:
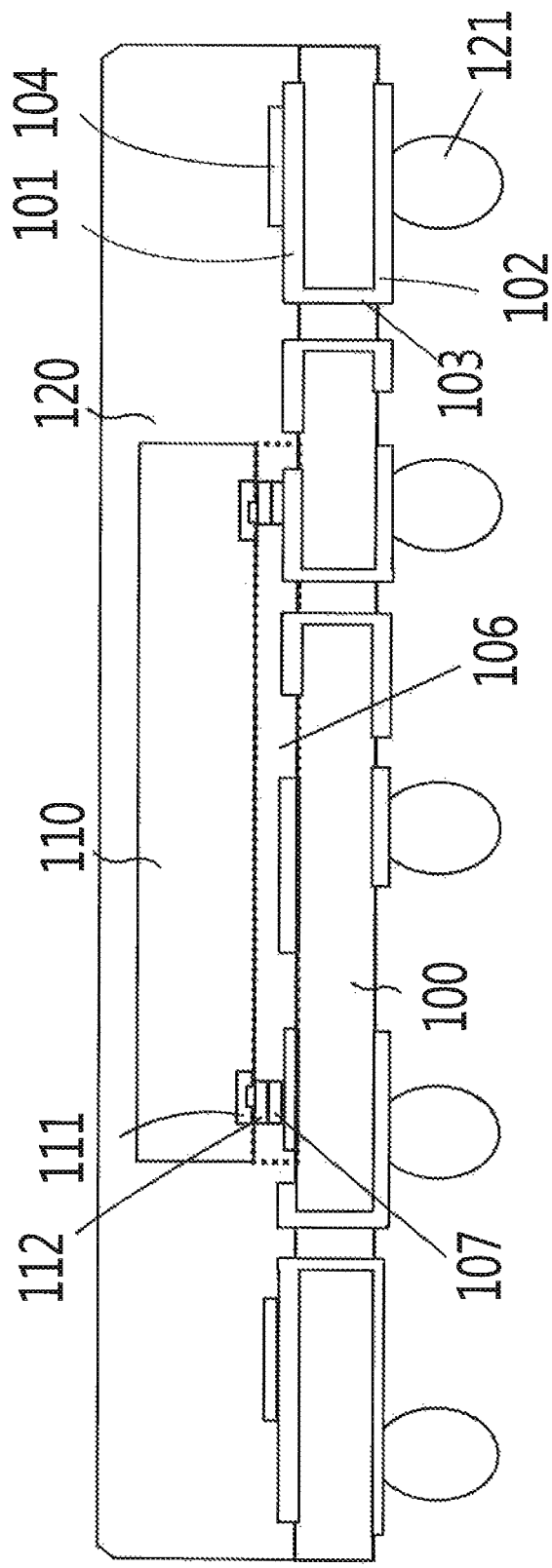
FIG. 3 illustrates a cross-sectional view of a semiconductor device package structure with solder balls according to another embodiment of the invention.

In one embodiment, the semiconductor device package structure further comprises a cover layer 120 is formed on the top surface of the substrate 100 and the bottom surface of the die 110 to cover the die 110 and the substrate 100, shown in FIG. 2, In another embodiment, the contact conductive bump 105 may be replaced by solder balls 121, shown in FIG. 3. The cover layer 120 is formed by a bonding process. The cover layer 120 is a dry film with high/low filler layer for easy to form the sharp structure and protect the die.

Figure 4:
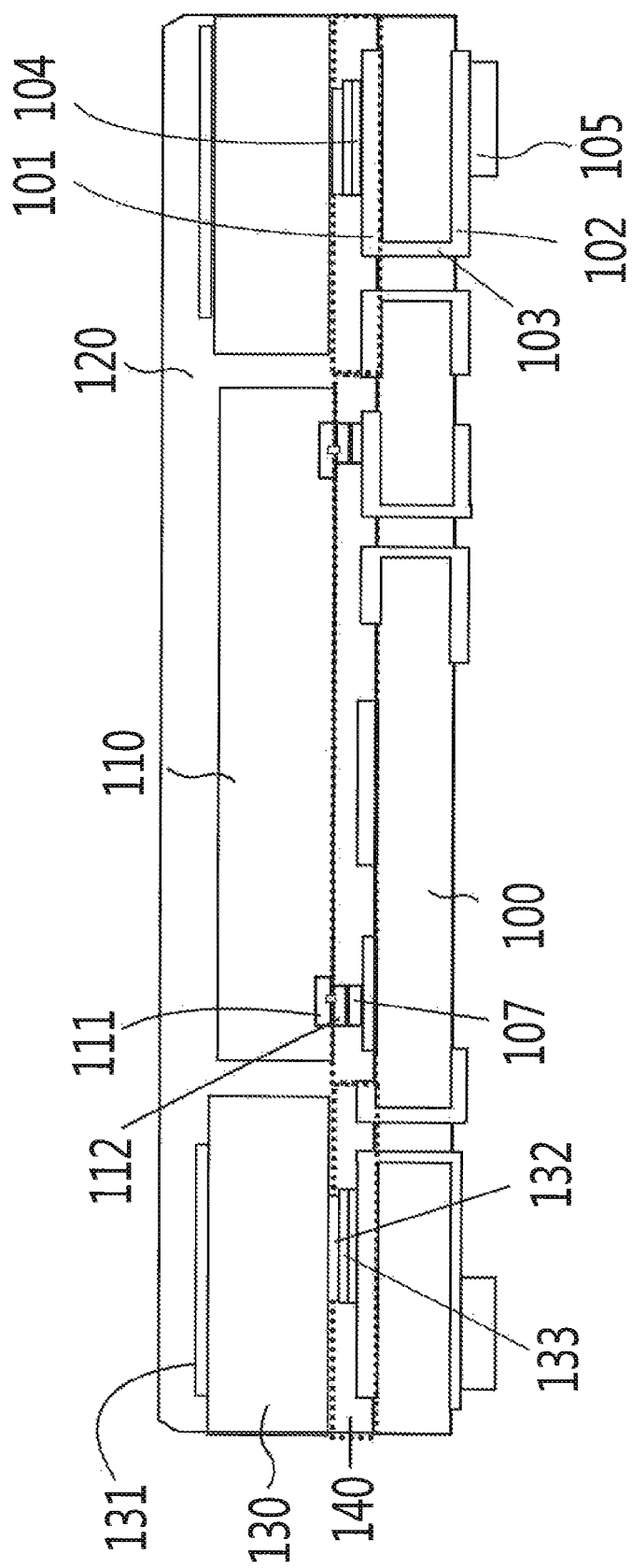
FIG. 4 illustrates a cross-sectional view of a semiconductor device package structure with second substrate according to yet another embodiment of the invention.

In one embodiment, based-on the FIG. 2, the semiconductor device package structure further comprises a second substrate 130 disposed between the cover layer 120 and the substrate 100, shown in FIG. 4. The second substrate 130 includes a wiring pattern 131 formed on a top surface of the second substrate 130 and a wiring pattern 132 formed on a bottom surface of the second substrate 130. In one embodiment, the wiring pattern 101, 102 may be pre-formed on the first substrate 100. In one embodiment, the wiring pattern 131, 132 may be pre-formed on the second substrate 130. The second substrate 130 has a die receiving opening for receiving a die/chip 110. The die 110 is disposed within the die receiving opening of the second substrate 130. The thickness of the die 110 is from around 50 um to 250 um. The second substrate 130 is formed on the first substrate 100 via an adhesive layer 140. The thickness of the first substrate 100 and the second substrate 130 is from 50 um to 100 um (it also can be thicker than 100 um or thinner than 50 um if necessary). The adhesive layer 140 (can be the same materials of adhesive layer 106) is formed on the top surface of the substrate 100 and the wiring circuit 101 of the substrate 100, wherein the adhesive layer 140 is formed between the die 110/the second substrate 130 and the substrate 100 to adhere a top surface (active area surface) of the die 110/the second substrate 130 and the top surface of the subs Irate 100. The thickness of the adhesive layer 140 is from 30 um to 100 um. As the same, a photo-lithography process is performed to open the "bump" area on the first substrate 100 for exposing the adhesive layer 140. The wiring pattern 132 is connected to the wiring pattern 101 (through conductive bump 104). In this embodiment, the cover layer 120 is formed on the top surface of the second substrate 130 and the bottom surface of the die 110 to cover the die 110 and the second substrate 130, shown in FIG. 4. In one embodiment, material of the cover layer 120 may be filled the gap between the die 110 and the second substrate 130. Weight of the gap is smaller than 200 um (it also can be greater than 200 um if necessary).

Figure 5:
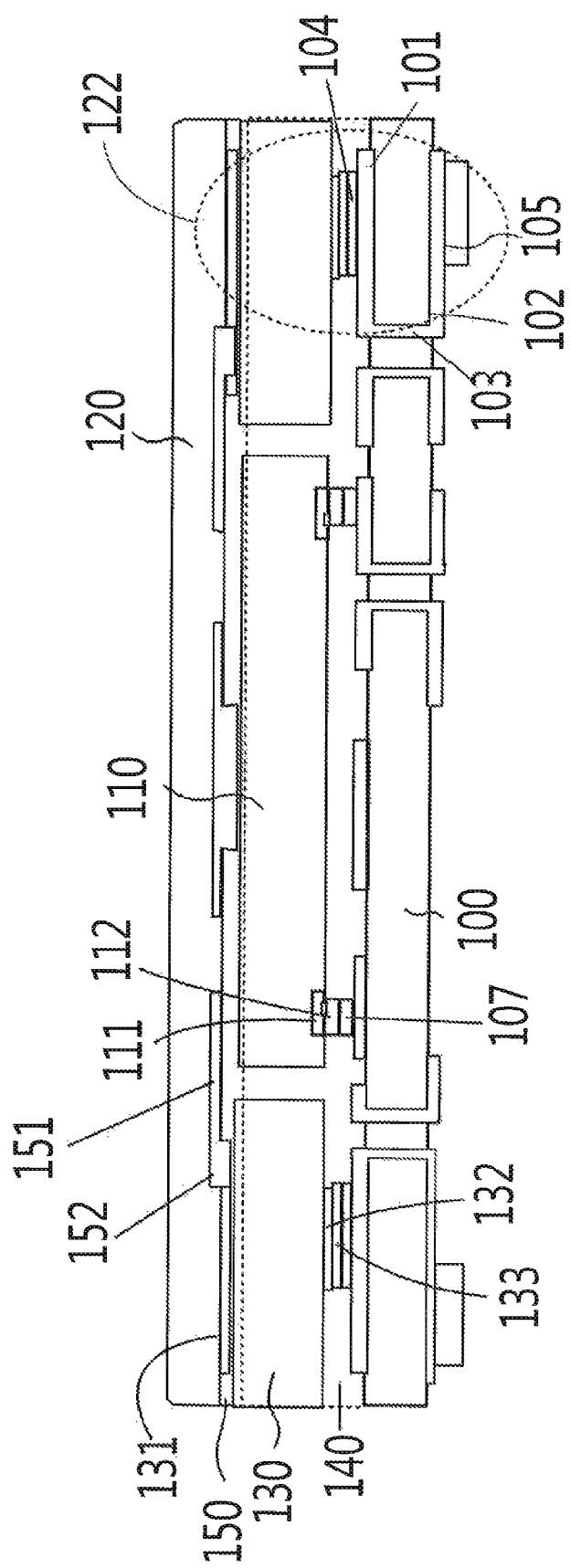
FIG. 5 illustrates a cross-sectional view of a semiconductor device package structure with second substrate and RDL according to one embodiment of the invention.

In one embodiment, based-on the FIG. 4, the semiconductor device package structure further comprises a dielectric layer 150, a redistributed metal layer (RDL) 151 and via 152, shown in FIG. 5. The dielectric layer 150 is formed on the top surface of the second substrate 130 and the bottom surface of the die 110 to cover the die 110 and second substrate 130. A photo-lithography process is performed to open the "via"

area on the second substrate 130 for exposing the contact pads of second substrate 130. In one embodiment, the RDL 151 and via 152 may be formed in the continuous process. The dielectric layer 150 is formed on the die 110 and the second substrate 130 with openings for via 152 formed therein, it prefers as thin as possible for the dielectric layer 150 for better reliability concerning. The redistributed metal layer (RDL) 151 is formed on via 152 and the dielectric layer 150 for coupling to via 152. The dielectric layer 150 fills into the gap between the die 110 and the second substrate 130 in this application. The cover layer 120 covers the dielectric layer 150 and the RDL 151.

Figure 6:
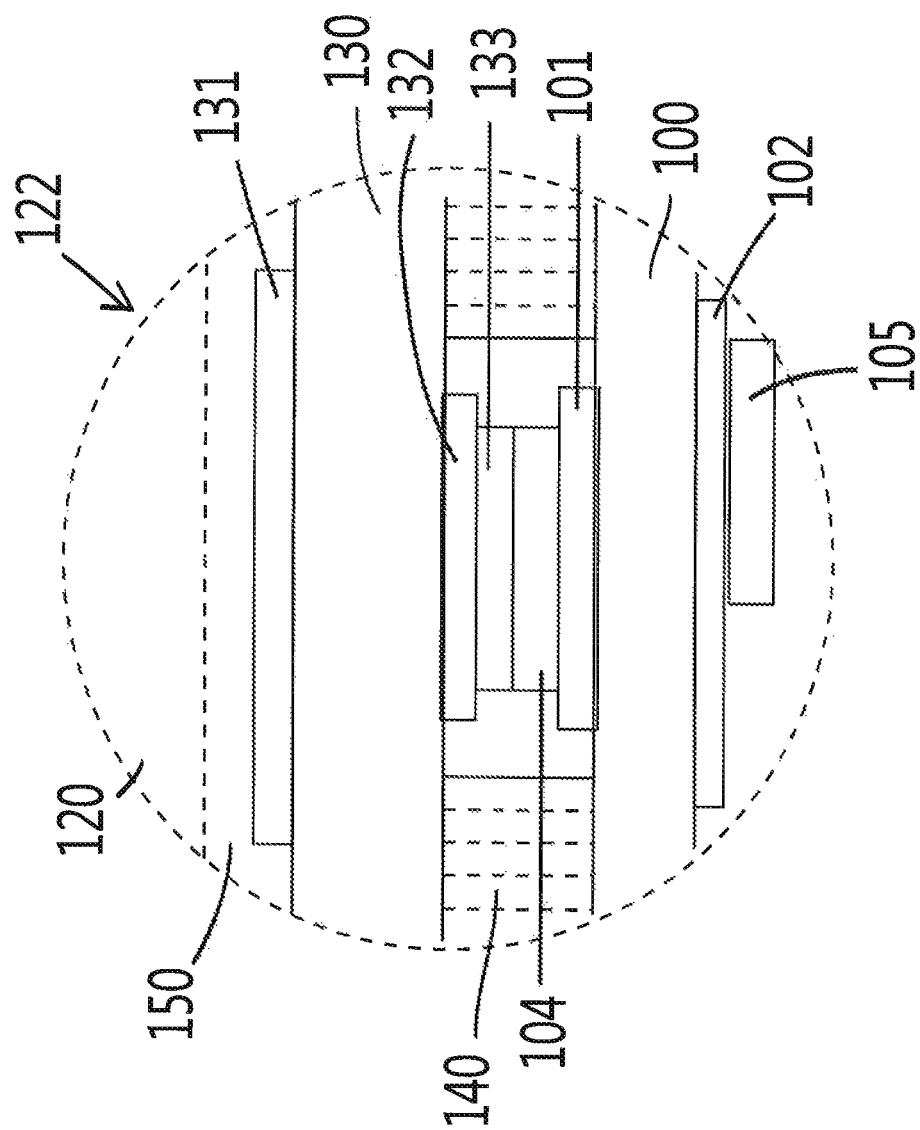
FIG. 6 illustrates a cross-sectional view of a side portion of the semiconductor device package structure according to the invention.

The detailed structure of layer-by-layer indicated by number 122 may be referred to FIG. 6. It is shown that the inter-connecting between the first substrate 100 and the second substrate 130 is through the conductive bump 104 and 133 respectively.

Figure 7:
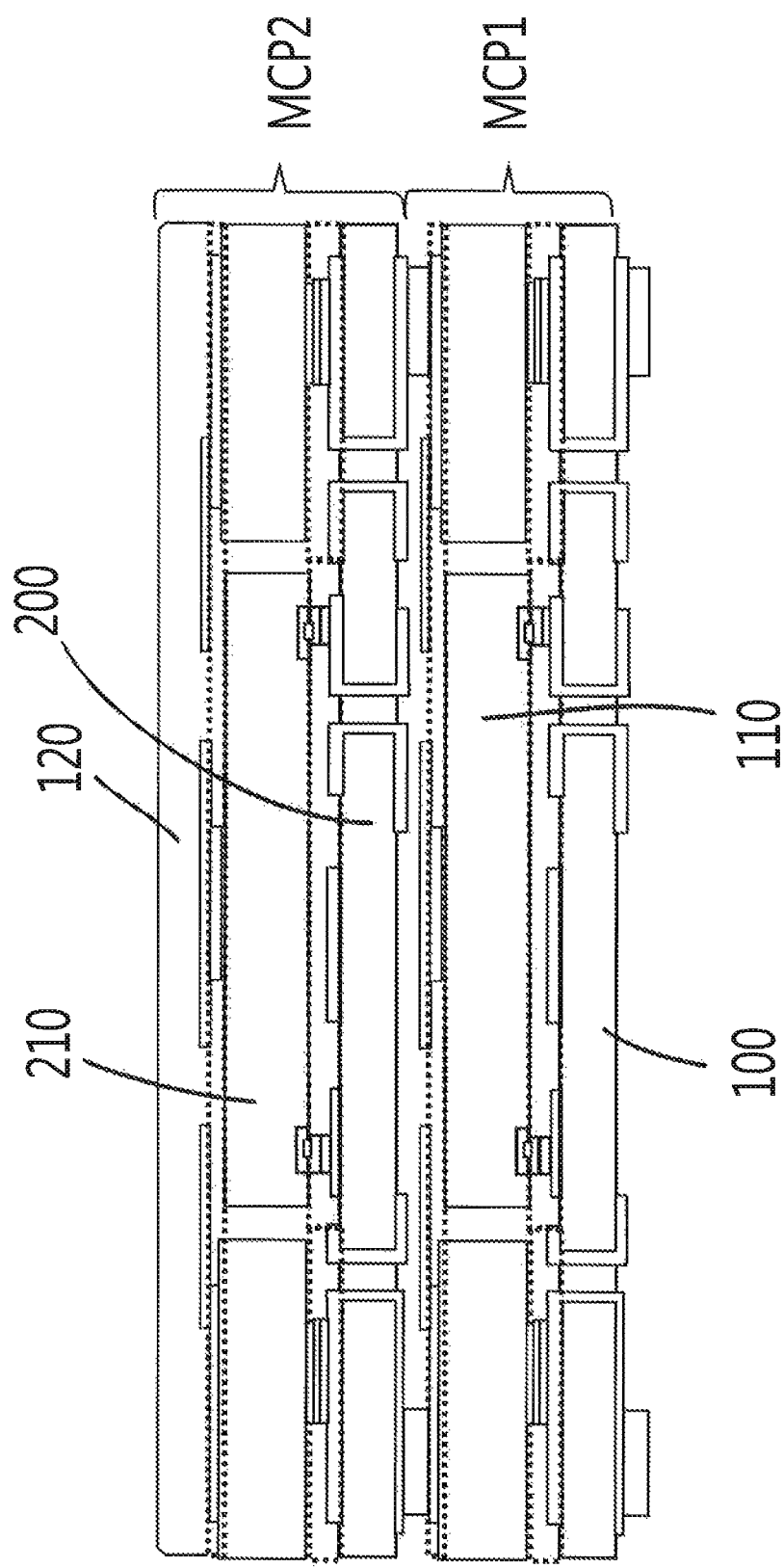
FIG. 7 illustrates a cross-sectional view of a multiple chips stacked package structure according to the invention.

In one embodiment, based-on the FIG. 5, the stacked semiconductor device package structure may be achieved by performing a duplicating manufacturing process, shown in FIG. 7. In the stacked chips package structure, it includes multiple chips package (MCP), MCP1 and MCP2, wherein MCP2 may include dice/chip 210 placed on the second substrate 200, and MCP1 may include dice/chip 110 placed on the first substrate 100. The cover layer 120 is the top layer of the package structure.

Figure 8:
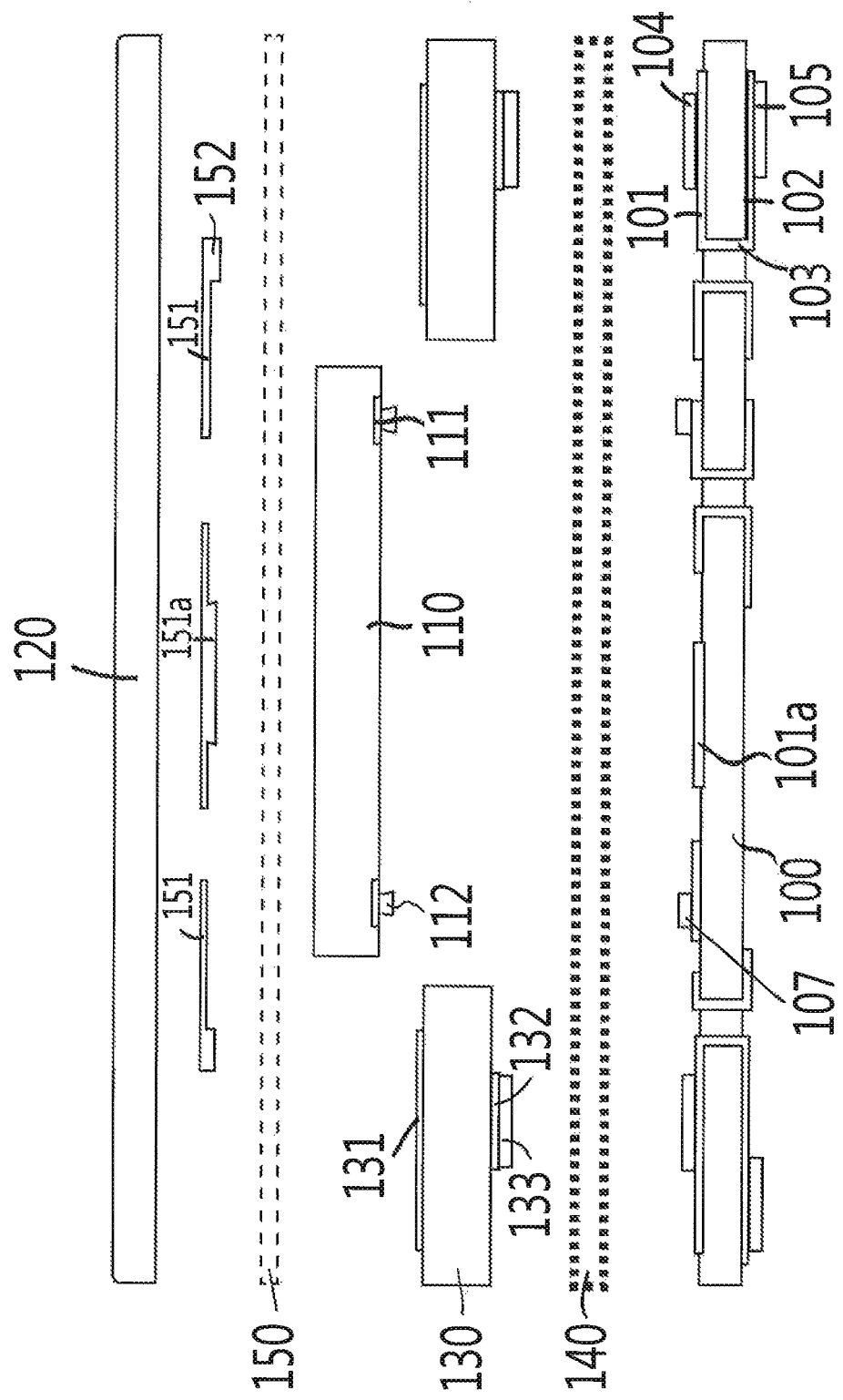
FIG. 8 illustrates a cross-sectional view of a first substrate, a second substrate and a die before connection according to one embodiment of the invention.

FIG. 8 illustrates a cross-sectional view of a first substrate, a second substrate and a die before connection according to one embodiment of the invention. The processes of forming the image package of the present invention includes preparing a first substrate 100 and a second substrate 130 (preferably organic substrate FR4/FR5/BT raw material) and the first substrate 100 has wiring circuit 101, 102 formed on a top surface and a bottom surface of the first substrate 100, respectively. The wiring pattern 131, 132 are formed on a top surface and a bottom surface of the second substrate 130, respectively. The layers 101, 102, 131 and 132 of the substrates may be formed by E-plating with Cu/Ni/Au. The connecting conductive through holes 103 may be formed by passing through the first substrate 100, in the same concept, the connecting through holes (not shown in drawing) may be formed by passing through the second substrate 130. The second substrate 130 has a pre-formed die receiving opening with the size larger than die size plus around 100 um-200 um per side by laser cutting or mechanical punching (multiple dice puncher). The second substrate 130 is attached (adhesion film) on the first substrate 100 via the adhesive layer 140, and inter-connecting through the bump structure.

The next step is to set the die 110 into the die receiving opening of the second substrate 130 by picking, aligning and placing the die 110 into the die open area of the second substrate 130 and on the adhesive layer 140, by die/substrate placement and alignment tool. The alignment mark 101a is for the die 110 aligning. For aligning, conductive bump 112 on the die 110 aligns to conductive bump 107 under the die 110, and conductive bump 133 on the second substrate 133 aligns to conductive hump 104 under the second substrate 130. The next step is panel bonding process to press the die/the second substrate under the vacuum, pressure and temperature conditions to be bonded to the first substrate. Subsequently, the dielectric layer 150 is formed on the top surface of the second substrate 130 and the bottom surface of the die 110 and fill into the gap between the die 130 and the second substrate 130, and then opening the "via" area on the second substrate 130. The redistributed metal layer (RDL) 151 is formed on via 152 and the dielectric layer 150 for coupling to via 152. Finally, the cover layer 120 is formed to cover the dielectric layer 150 and the RDL 151.

According to the above mentioned package structure, a method for forming a semiconductor device package could be comprising the following steps: preparing the carrier tools (glass tool) with an alignment mark; setting the bottom substrate with wiring circuits on both site, and an adhesive layer on the top surface of the bottom substrate, then aligning the bottom substrate on the carrier tools with alignment mark matching; followed-by setting the top substrate with wiring circuit on both site, and die open area, then aligning and placing the top substrate on the adhesive layer of the bottom substrate; aligning and placing (flip chip) a die with metallization bump structure into the die open area and attached on the adhesive layer of the bottom substrate; a panel bonding machine with one process step to bond the bottom substrate with adhesive layer, the top substrate and die together with carrier tools together under high vacuum, high temperature and pressure on panel conditions to adhere the top, bottom substrate and die together and re-flowing (increase the temperature to eutectic-point) the metallization bump for electrical inter-connecting between the bottom substrate, the top substrate and the die. The bonding process conditions are described as follows:

Putting the "panel" (substrates and chips) and tools (glass carriers) into the chamber—on the bottom stage—"with hot plate function" of the panel bonder machine;

Turning on the vacuum till at least $10^{-2}$ torr;

Setting the up stage pressure on "panel+tools" at least 100 kg; (it will depends on the panel size)

Fixing the up stage at a pre-determined position;

Increasing the temperature to 120~180° C. for few minutes; (to adhere the substrates and chips by the adhesive layer)

Increasing the temperature to 250~300° C. for about 1 (or few) minute "re-flow at eutectic point", then decreasing the temperature to 50~80° C. for few minutes by cooling water as profile;

Releasing the vacuum and purge $N_2$ air at the same time;

Releasing the up stage from "panel+tools";

Opening the chamber and removing the "Panel and Tools", then

Separating the tools to complete the panel bonding process.

The method further comprises bonding a cover layer film on the top surface of the top substrate and the bottom of the die under the vacuum, high temperature and pressure condition. The method further comprises forming solder bump, solder ball or gold bump on the bottom surface of wiring circuit of the bottom substrate. The method further comprises forming a metal re-distribution layer on top surface of the top substrate. The method further comprises surface mounting the passive and/or active components on the metal re-distribution layer (RDL).

Figure 9:
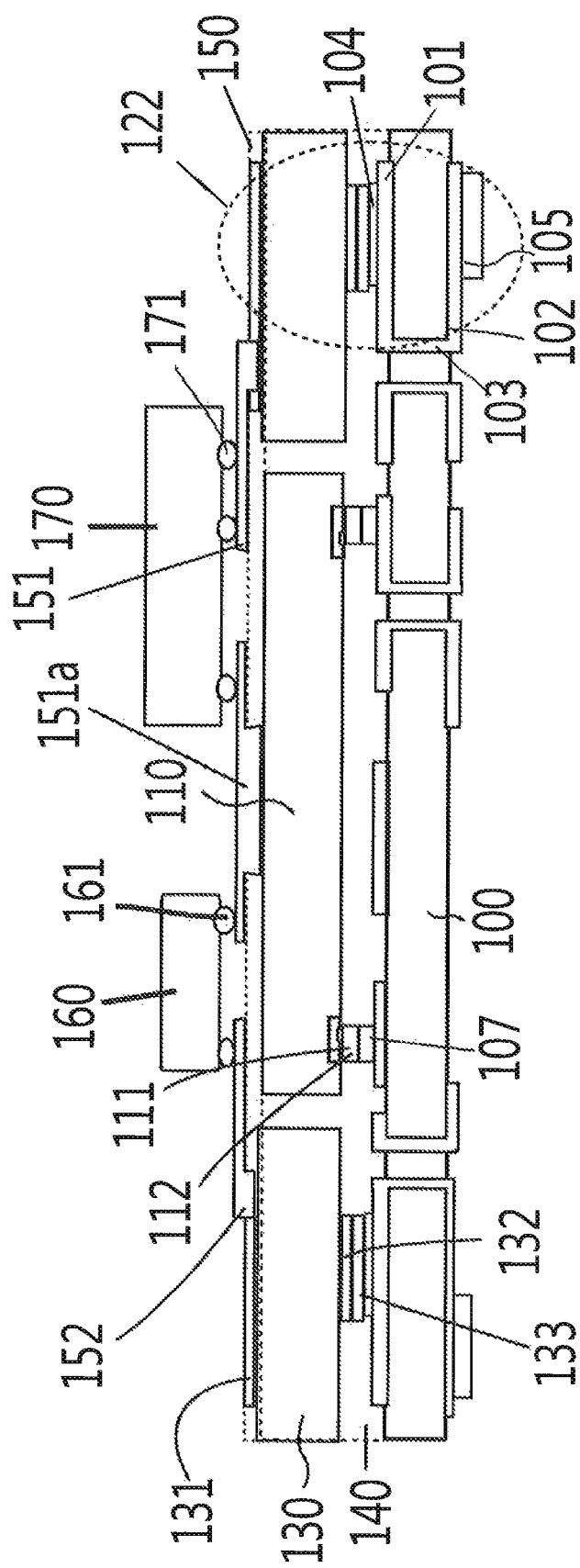
FIG. 9 illustrates a cross-sectional view of a semiconductor device package structure with passive and active component on RDL according to the embodiment of the invention.

In one embodiment, based-on the aforementioned FIG. 5, after the RDL 151 is formed, an active device (IC) 170 and/or a passive component 160 is also attached (SMT) on the die 110 and the second substrate 130, wherein contact conductive bump 161 is electrically connected to the RDL 151, thermal pad 151a and the passive component 160, and contact conductive bump 171 is electrically connected to the RDL 151, thermal pad 151a and active device 170, shown in FIG. 9. The passive component 160 could be such as a capacitor or a resistor. A further die formed by WL-CSP, CSP, BGA, Flip Chips, can also be mounted on RIX, 151 of the second substrate 130.

Figure 10:
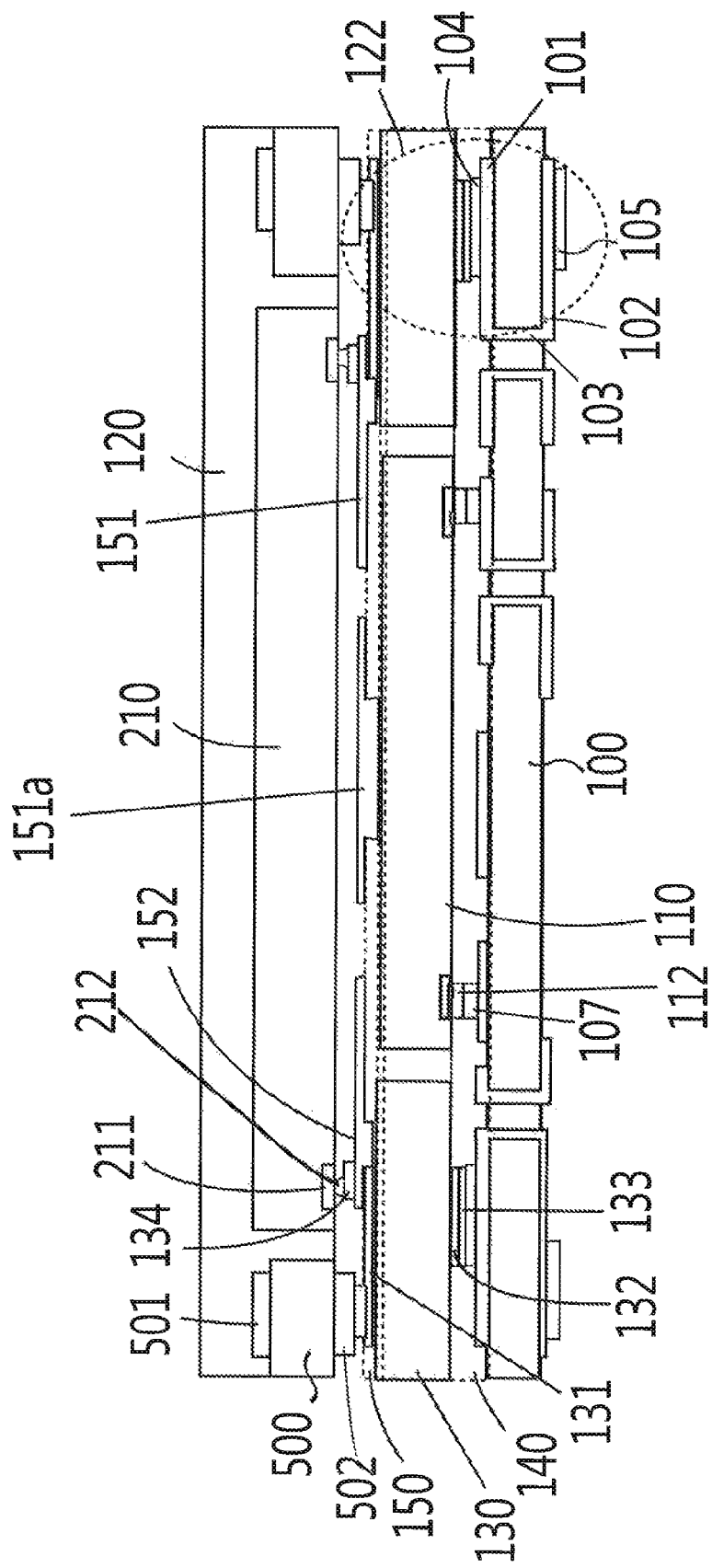
FIG. 10 illustrates a cross-sectional view of a multiple chips package structure according to another embodiment of the invention.

In one embodiment, based-on the aforementioned FIG. 5, after the RDL 151 is formed, a third substrate 500 and a die 210 are placed on the die 110 and the second substrate 130, wherein contact conductive bump 212 on the die 210 is electrically connected to contact conductive bump 134 (or via 152) on the second substrate 130, and the third substrate 500 has wiring circuit 501, 502 formed on a top surface and a bottom surface of the third substrate 500, respectively, shown in FIG. 10. The cover layer 120 is formed on the die 210 and the third substrate 500 to cover the die 210 and the third substrate 500 and fill into the gap between the die 210 and the third substrate 500.

Figure 11:
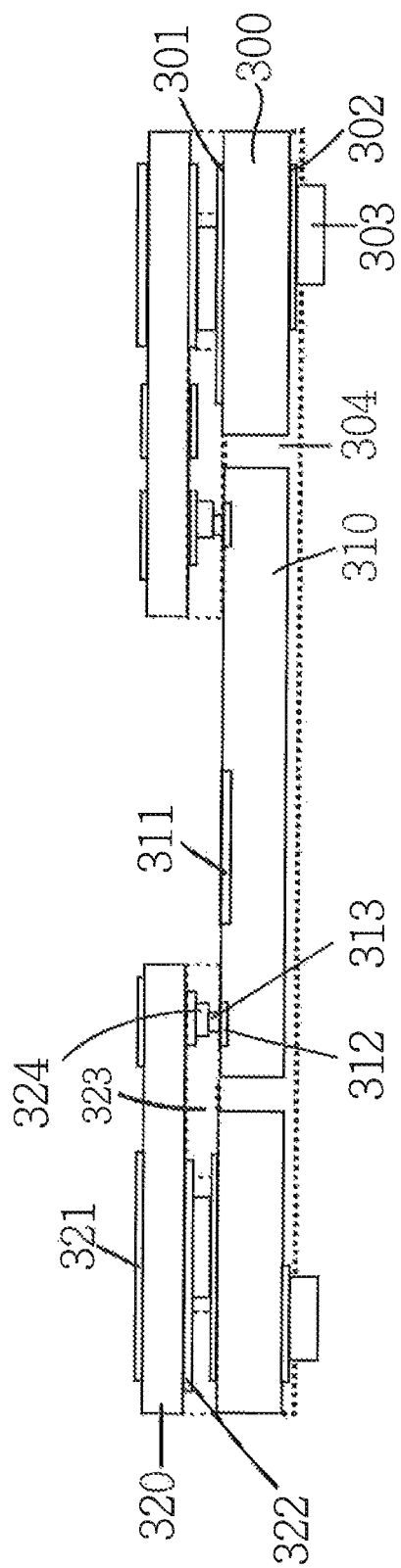
FIG. 11 illustrates a cross-sectional view of a semiconductor package structure for MEMS sensor device according to one embodiment of the invention.

The package structure for MEMS sensor device includes a first substrate 300, a sensor die/chip 310, an adhesive layer 304, another adhesive layer 323 and a second substrate 320, shown in FIG. 11. The first substrate 300 includes a wiring pattern 301 on a top surface of the first substrate 300 and a wiring pattern 302 on a bottom surface of the first substrate 300. A contact conductive bump 303 may be formed on the wiring pattern 302 of the first substrate 300. The first substrate 300 has a die receiving opening for receiving the sensor die/chip 310 which has a sensing array 311 formed thereon. The sensor die 310 has conductive (such as Al or Au) pads 312 (I/O pads) formed thereon. The sensor die 310 is disposed within the die receiving opening of the first substrate 300. In one embodiment, the sensor chip 310 is an image sensor chip, a navigate sensor chip, a pressure sensor chip, a CDR sensor (fluidic sensor) chip, a voice sensor chip, or a bio-chip sensor. The second substrate 320 is formed on the first substrate 300, with die opening window for exposing the sensing array 311, a wiring pattern 321 formed on a top surface of the second substrate 320 and a wiring pattern 322 formed on a bottom surface of the second substrate 320. Contact conductive bump 324 is formed on the wiring circuit 322 for coupling to the conductive bump 313 of die 310. The size of die opening window of the second substrate 320 is smaller than that of the die receiving opening of the first substrate 300. The adhesive layer 304 is formed on the bottom surface of the first substrate 300 and the wiring circuit 302 of the first substrate 300, and filled into the gap wherein the sensor chip 310 and the first substrate 300 to adhere the sensor chip 310 and the first substrate 300. The adhesive layer 323 is formed/filled under the second substrate 320, except the die opening window. Thus, no adhesive layer is formed on the area of the contact conductive bump 312, 324 and the die opening window. Thus, the adhesive layer 323 is "under-fill" adhesive layer (under the second substrate 320). A photo-lithography process and a developing process are performed to open the "bump" area on the first substrate 300 for exposing the contact conductive bump 303.

In one embodiment, a material of the first, second, third or more substrate includes BT, FR4, FR5, PT, ceramic, glass, silicon or metal.

The advantages of the invention includes (i) using solder/stud bump structure for inter-connecting between substrate and die with better reliability due to CTE mismatching issue between die and substrate; (ii) using adhesive layer as under-fill function to protect the die and improve the reliability; (iii) simple process and better yield for built the bump structure except the electrical through-holes area instead of re-filling material into through-hole for inter-connecting between substrates and die/chips; (iv) using the simple panel bonding method, it can avoid the die/chip tilt in Z-direction that may cause the performance issue of sensor chip. It also shows the chip last process to avoid the chip damage issue.

The System in Package structure and panel process are simple than conventional image package which fails to disclose the multi-chip and dual substrates structure. The thickness of the device package is easy to be controlled and die shift issue will be eliminated during process. The substrate is pre-prepared with pre-formed die opening window, interconnecting through holes; the size of die receiving opening window is equal to die size plus around >100 um-200 um per side; it can be used as stress buffer releasing area by filling the adhesive elastic core paste materials to absorb the thermal stress due to the CTE between silicon die and substrate (FR5/BT) is difference, additionally, it can fill the elastic dielectric materials to the gap between die edge and side wall of the substrate to absorb the mechanical bending and/or thermal stress due to the CTE mismatch. The packaging throughput will be increased (manufacturing cycle time was reduced) due to apply the simple build up layers on top the surface and bottom site of the substrates at the same time. The die and substrates (both second and first substrates) be bonded together (both mechanical adhesion and electrical inter-connecting) by using panel bonding process. The reliability for both package and board level is better than ever, especially, for the board level temperature cycling test, it was due to the CTE of substrate and PCB mother board are identical, hence, no thermal mechanical stress be applied on the solder humps/balls; for the board level mechanical bending test, it was due to bottom side of substrate to support the mechanical strength allowing absorb the stress generated at top side die area and boundary area.

The foregoing descriptions are preferred embodiments of the present invention. As is understood by a person skilled in the art, the aforementioned preferred embodiments of the present invention are illustrative of the present invention rather than limiting the present invention. The present invention is intended to cover various modifications and similar arrangements included within the spirit and scope of the appended claims, the scope of which should be accorded the broadest interpretation so as to encompass all such modifications and similar structures.

What is claimed is:

1. A semiconductor device package, comprising:
    a first substrate with a die receiving opening and a first wiring circuit on a top surface of said substrate and a second wiring circuit on a bottom surface of said substrate, wherein a first contact conductive bump is formed on said first wiring circuit;
    a die with at least one bump structure on at least one of bonding pads formed on a bottom surface of said die, wherein said bump structure of said die is electrically connected to said first contact conductive bump of said first wiring circuit of said first substrate;
    a first adhesive layer on said bottom surface of said first substrate and said die, and filled into the gap between said die and said first substrate for adhering said die and said first substrate; and
    a second substrate with a die opening window and a third wiring circuit on a top surface of said second substrate and a fourth wiring circuit on a bottom surface of said second substrate, wherein a second contact conductive bump is formed on said fourth wiring circuit; and
    wherein said second contact conductive bump of said second substrate is electrically connected to said first contact conductive bump of said first wiring circuit of said first substrate;
    a second adhesive layer formed under said second substrate except said die opening window for adhering said die and said second substrate.

2. The package of claim 1, wherein a size of said die opening window of said second substrate is smaller than that of said die receiving opening of said first substrate, wherein the thickness of said bump structure and the first contact conductive bump is smaller than 75 micrometers, the thickness of said second contact conductive bump and said first contact conductive bump is smaller than 75 micrometers.

3. The package of claim 1, wherein said die is a MEMS sensor device, an image sensor chip, a navigate sensor chip, a pressure sensor chip, a CDR sensor (fluidic sensor) chip, a voice sensor chip, or a bio-chip sensor.

* * * * *